United States Patent [19]

Bentlage et al.

[11] Patent Number: 5,099,393

[45] Date of Patent: Mar. 24, 1992

[54] ELECTRONIC PACKAGE FOR HIGH DENSITY APPLICATIONS

[75] Inventors: James R. Bentlage, Binghamton; David E. Engle, Vestal; Geoffrey R. Mariner, Apalachin; John J. Squires; John H. Williams, both of Endicott, all of N.Y.

[73] Assignee: International Business Machines Corporation, Armonk, N.Y.

[21] Appl. No.: 674,249

[22] Filed: Mar. 25, 1991

[51] Int. Cl.⁵ .................. H01R 9/09; H01R 23/68
[52] U.S. Cl. .................. 361/413; 361/400; 361/398; 439/67; 439/73; 439/77; 439/84; 439/248; 439/493; 174/52.4
[58] Field of Search .............. 361/398, 412, 413, 400, 361/401; 439/67, 68, 69, 71, 73, 77, 84, 90, 91, 247, 248, 492, 493; 357/70, 74, 79; 174/52.4

[56] References Cited

U.S. PATENT DOCUMENTS

| | | |
|---|---|---|
| 3,586,917 | 6/1971 | Oates . |
| 3,861,135 | 1/1975 | Seeger, Jr. et al. . |
| 3,883,213 | 5/1975 | Glaister . |
| 3,971,610 | 7/1976 | Buchoff et al. . |
| 4,018,496 | 4/1977 | Bilsback . |
| 4,029,999 | 6/1977 | Neumann et al. . |
| 4,064,623 | 12/1977 | Moore . |
| 4,116,516 | 9/1978 | Griffin . |
| 4,150,420 | 4/1979 | Berg . |
| 4,184,729 | 1/1980 | Parks et al. . |
| 4,329,732 | 5/1982 | Kavli et al. . |
| 4,538,865 | 9/1985 | Wakabayashi et al. . |
| 4,587,596 | 5/1986 | Bunnell . |
| 4,597,617 | 7/1986 | Enochs . |
| 4,647,125 | 3/1987 | Landi et al. . |
| 4,744,009 | 5/1988 | Grabbe et al. . |
| 4,768,971 | 9/1988 | Simpson . |
| 4,787,854 | 11/1988 | Le Parquier . |
| 4,849,856 | 7/1989 | Funari et al. . |
| 4,878,846 | 11/1989 | Schroeder . |
| 4,902,234 | 2/1990 | Brodsky et al. . |
| 4,914,551 | 3/1990 | Anschel et al. . |
| 4,937,707 | 6/1990 | McBride et al. . |
| 4,969,828 | 11/1990 | Bright et al. .............. 439/73 X |

FOREIGN PATENT DOCUMENTS 0055640 11/1981 European Pat. Off. .
0700490 12/1953 United Kingdom .
1488226 10/1977 United Kingdom .

OTHER PUBLICATIONS

IBM TDB, vol. 7, No. 1, 06/64, pp. 101, 102, "Solderless Electrical Contacts".
IBM TDB, vol. 10, No. 10, 03/68, pp. 1462, 1463, "Connectors".
IBM TDB, vol. 13, No. 6, 11/70, p. 1589, "Contacting System".
IBM TDB, vol. 18, No. 2, 07/75, p. 340, "High-Density Strip Line Card Connector".
IBM TDB, vol. 21, No. 10, 03/79, pp. 3987, 3988, "Coaxial Connector".
IBM TDB, vol. 22, No. 2, 07/79, pp. 523, 524, "Shielded Connectors".

(List continued on next page.)

Primary Examiner—Leo P. Picard
Assistant Examiner—Paramita Ghosh
Attorney, Agent, or Firm—Lawrence R. Fraley

[57] ABSTRACT

An electronic package including a first circuitized substrate (e.g., printed circuit board) and a flexible circuitized substrate wherein the flexible substrate is precisely aligned in removable manner relative to the first substrate. This is accomplished utilizing a retention member and associated frame member, the flexible circuitized substrate being precisely aligned and secured to the frame member. Elastomeric pressure exertion members are utilized to exert pressure against each of a plurality of individual circuitized sections of the flexible circuit member to thus effect engagement between the flexible substrate's contacts and respective conductors which constitute part of the circuit on the first substrate. Moveable clamp members may also be used to engage extending posts of the retention member, said clamp members also possibly acting against a stiffener member located on the first substrate's opposite surface from the flexible substrate.

24 Claims, 6 Drawing Sheets

OTHER PUBLICATIONS

IBM TDB, vol. 24, No. 2, 07/81, pp. 905, 906, "Circular Clip Pressure Connector".
IBM TDB, vol. 25, No. 1, 06/82, p. 370, 371, "Electrical Connector For Flat Flexible Cable".
IBM TDB, vol. 25, No. 7A, 12/82, pp. 3438-3441, "Planar Electrical Connector".
Vol. 26, No. 3A, 08/83, pp. 1152, 1153, "Improved Flat Flexible Cable Connector", (TDB).
IBM TDB, vol. 26, No. 12, 05/84, p. 6657, "Flex Circuit Zero Insertion Force Connector".
IBM TDB, vol. 27, No. 3, 08/84, pp. 1499-1501, "Separable, Conformal, Low Profile Connector Means".
IBM TDB, vol. 28, No. 7, 12/85, pp. 2855, 2856, "Flexible Module Carrier Direct Connection Package".
Dow Corning Bulletin 17-047, 07/71, Information About Silastic Silicone Rubber.

ELECTRONIC PACKAGE FOR HIGH DENSITY APPLICATIONS

TECHNICAL FIELD

The invention relates to electronic package assemblies and particularly to such assemblies which utilize thin flexible circuits as part thereof. Even more particularly, the invention relates to such assemblies wherein a semiconductor device (chip) is electrically connected to the thin flexible circuit.

BACKGROUND OF THE INVENTION

Electronic packages which utilize thin flexible circuit members as part thereof are known in the industry, with examples being defined in U.S. Pat. Nos. 4,849,856, 4,914,551 and 4,937,707, all of which are assigned to the same assignee as the present invention. Understandably, a main objective in the design of such electronic packages is to provide a maximum number of electrical connections within a minimum of overall space. Such miniaturization efforts, while providing highly advantageous features, also present various engineering problems in both the manufacture and ultimate operation of these structures. One example of such a problem involves effective package heat removal during operation, such removal provided by the structures defined in the aforementioned U.S. Pat. Nos. 4,849,856 and 4,914,551.

Another particular problem facing designers of electronic packages containing thin film circuit structures is the essential requirement to provide sound and effective electrical connections between relatively large numbers of extremely small conductive elements (e.g., signal, ground and/or power conductors) on the flexible circuit and the respective contact locations (e.g., those conductors located on the printed circuit board or similar substrate) to which the flexible circuit is to be electrically connected, thus coupling the chip to the package's substrate. Typically, such flexible circuit-to-substrate connections have been made in most electronic packages of this type using solder or similar bonding material to thus form a substantially permanent connection. While soldering or similar techniques (e.g., thermocompression bonding) have proven successful to provide such connections, including at relatively high densities, such processes understandably add to the cost and time involved for manufacturing such structures. Further, because the resulting structure is substantially permanently attached at these locations, separability (e.g., as may be required during periods of repair) is virtually impossible. Accordingly, repair and/or replacement can prove to be relatively expensive and time-consuming.

In U.S. Pat. No. 4,597,617, there is shown an electronic package wherein a flexible circuit is utilized and connected to circuitry on the package's substrate (etched circuit board) without permanent attachment (e.g., soldering). Because the flexible circuit as described in this patent is maintained in relatively fixed alignment with respect to the package's retainer and associated heat sink members in the manner described, however, this package is not capable of providing high density electrical connections (e.g., between associated arrays of individual conductors located in closely spaced orientations) such as taught by the present invention. Further, use of a substantially singular elastomeric pressure pad for each side of the flexible circuit, as described in U.S. Pat. No. 4,597,617, does not provide the unique force application per individual circuit conductor as required in highly dense arrays (and as provided by the instant invention) and deemed necessary to assure high density connections between conductors as provided on flexible circuits and corresponding printed circuit boards or the like.

The invention, as defined herein, is capable of providing high density connections between individual conductor pads or the like arranged on the flexible circuit in a high density pattern with corresponding pads or the like on an associated substrate (e.g., printed circuit board) in both an expeditious and effective manner which, uniquely, also assures separability of the various parts of the final package in a facile manner to thus facilitate replacement and/or repair.

It is believed that an electronic package assembly possessing the several advantages specifically described herein and otherwise discernible from these teachings would constitute a significant advancement in the art.

DISCLOSURE OF THE INVENTION

It is, therefore, a primary object of the present invention to enhance the art of electronic packaging.

It is another object of the present invention to provide an electronic package which includes a thin film flexible circuit as part thereof and which provides electrical connection between relatively high densities of conductors on the flexible circuit and corresponding conductors on the package's substrate.

It is a still further object of this invention to provide such a package which can be produced in a relatively inexpensive manner in comparison to many known packages of the prior art, including particularly those wherein a flexible circuit is permanently attached to the corresponding substrate.

In accordance with one aspect of the invention, there is provided an electronic package comprising a first circuitized substrate including a plurality of conductors thereon, a frame member removably positioned on the first substrate so as to be precisely aligned relative to the first substrate's conductors, a semiconductor device electrically coupled to the first substrate, a second circuitized substrate securedly positioned to and precisely aligned on the frame member, pressure exertion means including a plurality of exertion members for exerting pressure against the second circuitized substrate to cause the contacts thereon to engage respective electrical conductors of the first circuitized substrate, and means for retaining the exertion members against the second circuitized substrate such that the defined pressure will be exerted thereagainst. The second circuitized substrate includes a common circuitized section and a plurality of individual circuitized sections electrically and mechanically connected to the common section, this common section adapted for thermally expanding relative to the plurality of circuitized sections. The semiconductor device (e.g., a chip) is fixedly positioned on the common circuitized section and electrically connected thereto.

BEST MODE FOR CARRYING OUT THE INVENTION

For a better understanding of the invention, together with other objects, advantages and capabilities thereof, reference is made to the following disclosure in connection with the aforementioned drawings.

Figure 1:
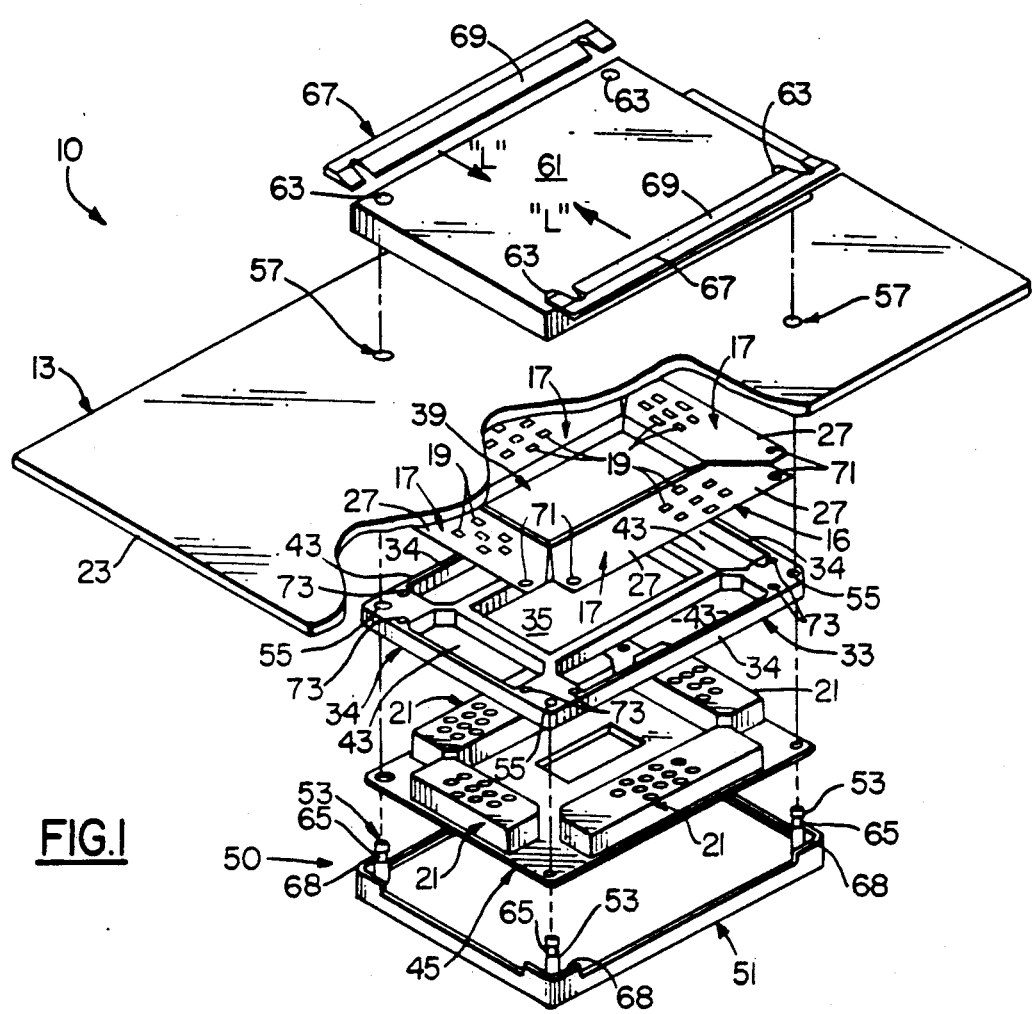
FIG. 1 is an exploded isometric view of an electronic package in accordance with one embodiment of the invention.

In FIG. 1, there is shown an electronic package 10 in accordance with a preferred embodiment of the invention. Package 10 includes a first circuitized substrate 13 with a plurality of electrical conductors 15 thereon (see FIGS. 2, 3, 8 and 9), a second circuitized substrate 16 including a plurality of individual circuitized sections 17 forming part thereof, each including a plurality of electrical contacts 19 thereon (see also FIGS. 2, 3, 8 and 9). Package 10 further includes a plurality of individual pressure (or force) exertion members 21, each for providing a predetermined pressure (or force) of relatively low magnitude against respective ones of the individual circuitized sections 17 sufficient to cause the respective conductors 15 and contacts 19 of substrates 13 and 16, respectively, to contact each other in a sound, effective manner. As understood herein, each exertion member 21 assures a sound electrical connection between each of the respective conductors and contacts while at the same time uniquely compensating for surface elevation variations in these elements as well as within the flexible substrate 16. Specifically, the invention assures sound connection between these elements despite differences in thickness of such conductors and contacts and/or the flexible substrate upon which the contacts are positioned. As further understood, the invention is able to provide this predetermined pressure over a relatively prolonged period of time, despite deleterious conditions such as relatively high heat and/or moisture to which the invention may be subjected.

In U.S. Pat. No. 4,902,234, assigned to the same assignee as the instant invention, there is defined a connector assembly wherein an elastomeric pressure exertion member is utilized to provide reliable contact pressure against at least one of the circuit members (e.g., a flexible circuit). This exertion member includes a base plate, a plurality of individual compressible elements located on one side of the plate, and a resilient member located on the plate's other side. The disclosure of U.S. Pat. No. 4,902,234 is thus incorporated herein by reference. As defined herein, the elastomeric exertion members of the invention provide a sound, reliable contact pressure of relatively low magnitude through the utilization of effective materials which are relatively inexpensive and which can withstand adverse environmental conditions such as excessive heat and moisture. As understood, these members thus represent an improvement over the concept defined in U.S. Pat. No. 4,902,234.

Although four individual circuitized sections 17 and a similar number of exertion members 21 are shown, it is understood that in the broader aspects of the invention, that the invention is not limited to this specific number.

Figure 8:
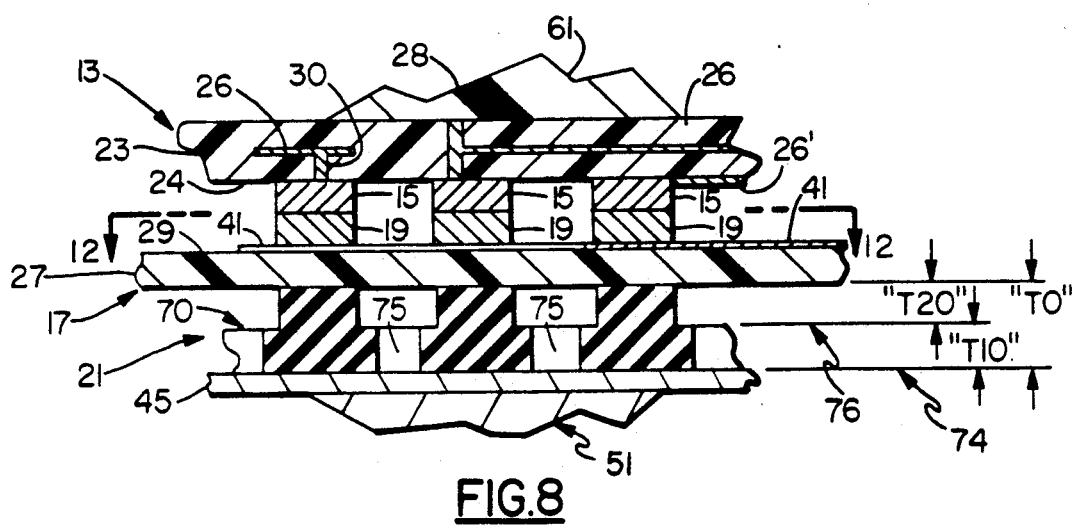
FIGS. 8 and 9 are partial, cross-sectional views, on a much enlarged scale, illustrating in significant detail the relative positions of the invention's elastomeric exertion members prior to and subsequent to package actuation.
Figure 9:
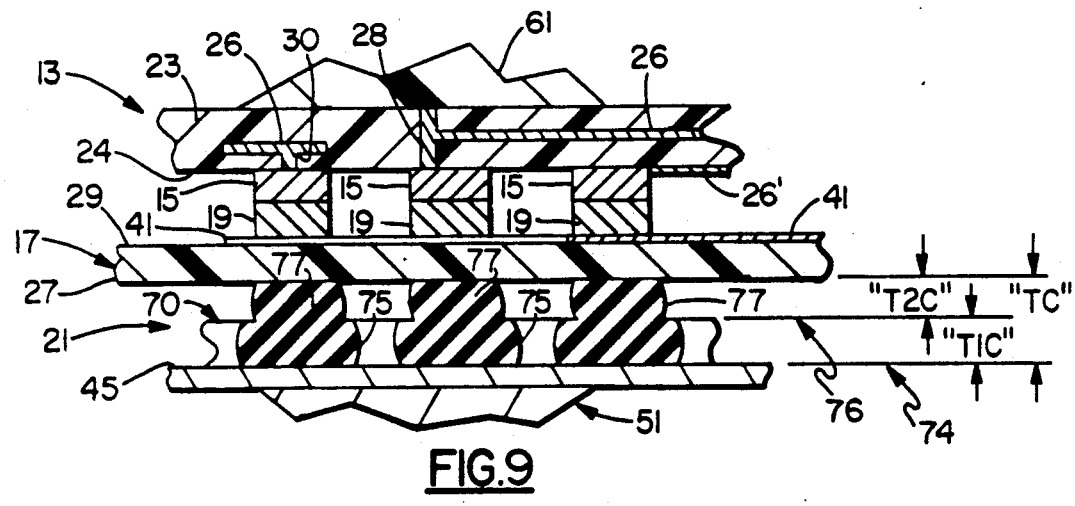

In a preferred embodiment, first circuitized substrate 13 comprises a printed circuit board (a/k/a printed wiring board) having a relatively rigid insulative substrate 23. Substrate 23 is preferably of a known material (e.g., epoxy resin and fiberglas) and includes the defined conductors 15 located along a first surface 24 thereof. Each conductor 15, as shown, is preferably of a flat configuration and comprised of a sound metallic conductive material (e.g., copper). As such, each conductor will also include a precious metal (e.g., gold) overplate for added corrosion protection. Each conductor 15 is positioned on the epoxy substrate 23 using techniques known in the printed circuit art and further description is thus not believed necessary. In one example of the invention, substrate 23 possessed a thickness of about 0.062 inch while each of the copper conductors 15 possessed an average thickness of only about 0.001 inch. As defined, each conductor 15 is substantially flat in configuration and thus constitutes a "metallic pad" to which connection is made. As defined below, such a configuration (flat) is also preferred for the contacts 19 of the invention's second circuitized substrate. Accordingly, the invention provides for sound connection between opposing, relatively flat metallic conductors and contacts in the manner depicted herein. It is understood, however, that the invention is not limited to such flat structures in that alternative designs for these elements may be utilized, with suitable examples including those of the dendritic variety such as defined in Canadian Patent 1,121,011 and in IBM Technical Disclosure Bulletins Vol. 22, No. 7 (Dec., 1979), pg. 2706 and Vol. 23, No. 8 (January, 1981), pg. 3631, the disclosures of which are also incorporated herein for reference. Still another structure suitable for use herein (particularly as conductors 15) is a pin-type conductor which includes a projecting tail or tip segment capable of insertion within substrate 23 (e.g., to connect to internal circuitry 26 therein). One such example is defined in U.S. Pat. No. 4,976,626, the disclosure of which is also incorporated herein by reference. Examples of internal circuitry 26 are depicted in FIGS. 8 and 9 and are well known in the printed circuit board (particularly that of the multilayered type) art. Such circuitry is not shown in FIGS. 2 and 3 for clarification purposes. Such circuitry may be in the form of signal, power or ground planes which may be electrically coupled to conductors 15 by known means, including plated-through-holes (represented in FIGS. 8 and 9 by the numeral 28) or "vias" (represented by numeral 30) which only partially penetrate the board's thickness. Circuitized substrate 13 may also include external circuitry 26' thereon (FIGS. 8 and 9) which in turn may be coupled to selected ones of the arrayed conductors 15, depending on the operational requirements for package 10.

Each circuitized section 17 of second circuitized substrate 16 preferably comprises a flexible substrate 27 having the described contacts 19 located on an upper surface 29 thereof (FIGS. 8 and 9). As stated, contacts 19 are also preferably of substantially flat configuration and, in one embodiment of the invention were comprised of copper and deposited on substrate 27 using known printed circuit technology. These also preferably include the aforementioned overplate. Again, however, use of conductors of different shapes (e.g., dendritic) is possible. The corresponding flexible substrate in this example was comprised of electrically insulative material (polyimide) and possessed a thickness within the range of about 0.002 inch to about 0.005 inch, thus assuring the flexibility desired for this element.

Figure 6:
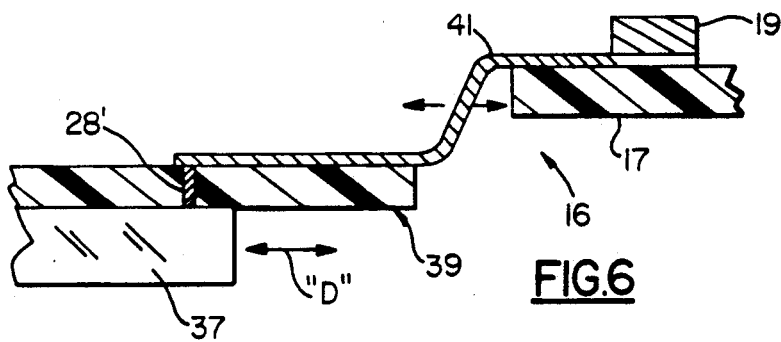
FIG. 6 is a much enlarged partial view, in section, as taken along the line 6—6 in FIG. 5, illustrating the relationship between the common circuitized section and the individual circuitized sections of the invention's second circuitized substrate.
Figure 7:
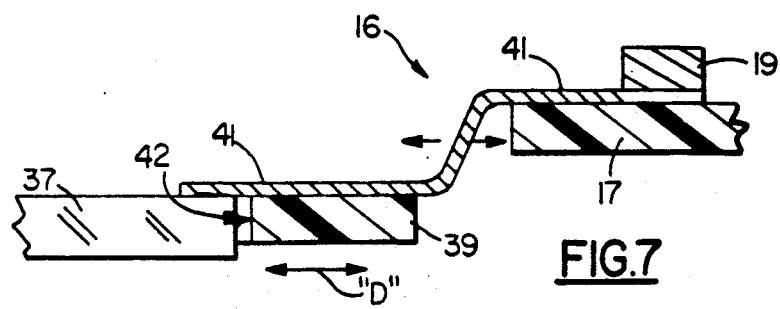
FIG. 7 represents an alternative embodiment of the components as depicted in FIG. 6.
Figure 2:
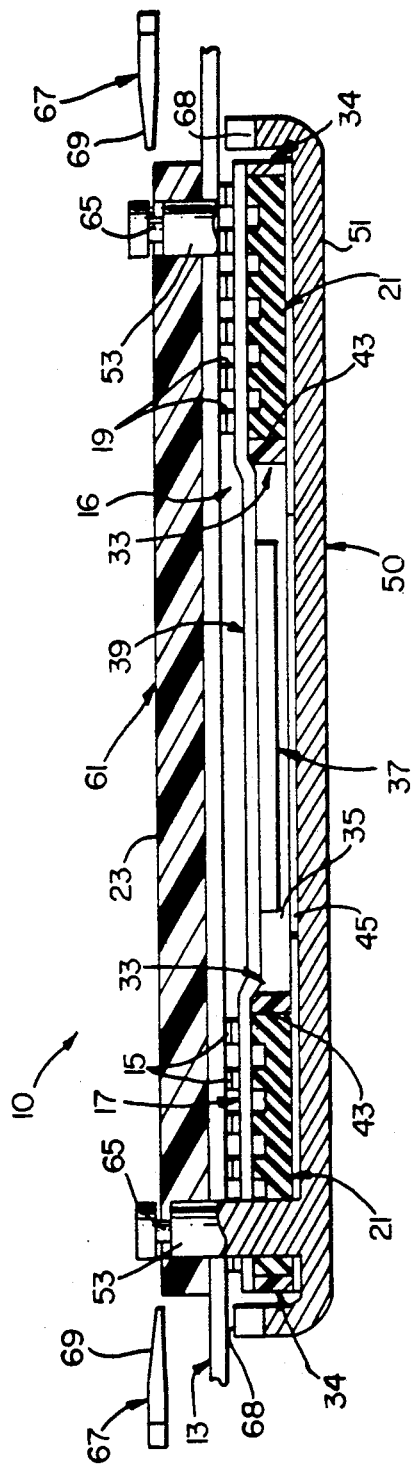
FIGS. 2 and 3 represent cross-sectional views, on an enlarged scale, of the electronic package of FIG. 1 in both the unactuated and actuated positions respectively.
Figure 3:
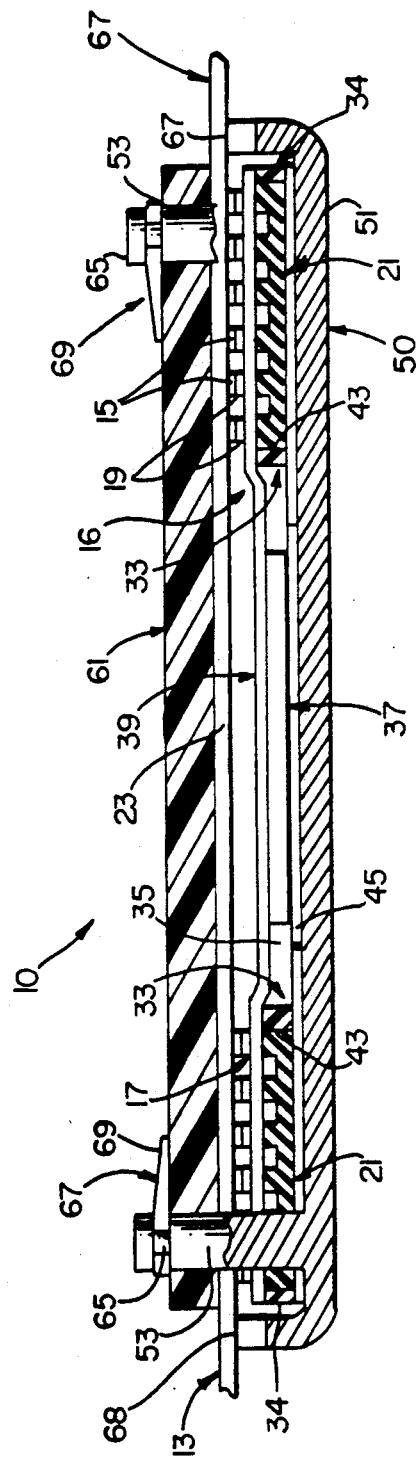
Figure 4:
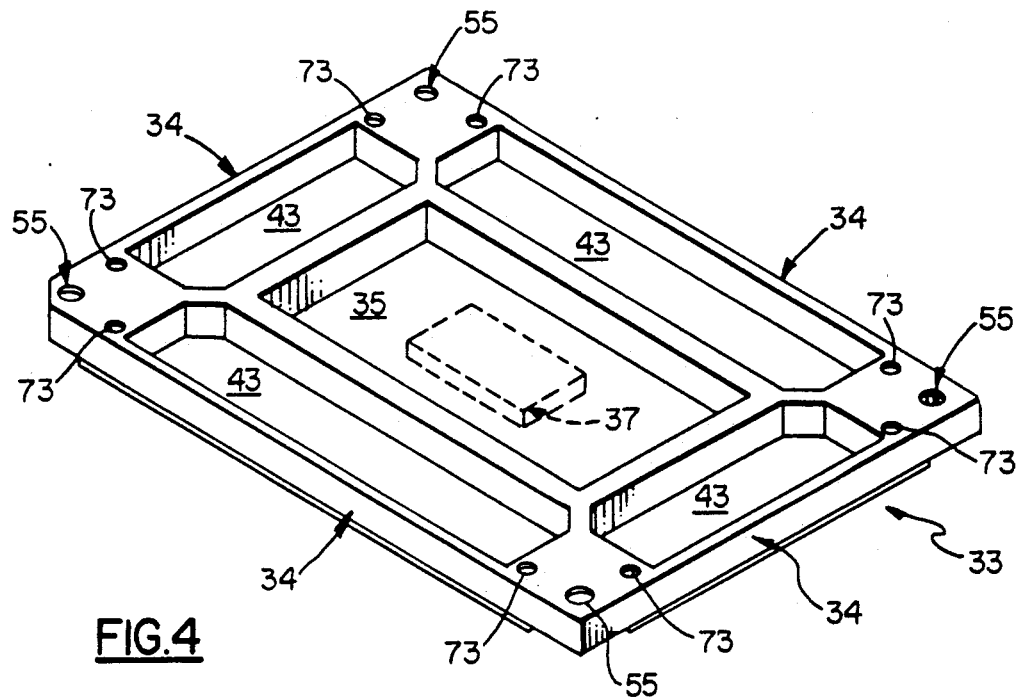
FIG. 4 is an isometric view, on an enlarged scale, showing one embodiment of the frame member for use in the electronic package of FIG. 1.
Figure 5:
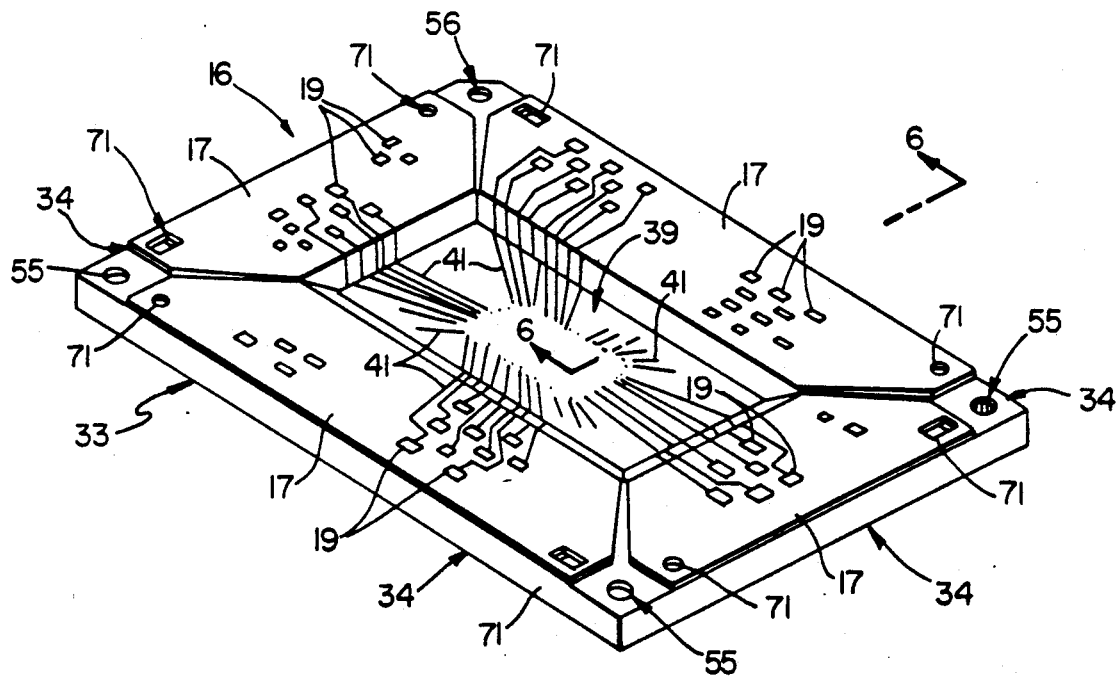
FIG. 5 illustrates the frame member of FIG. 4 including the invention's second circuitized substrate positioned thereon, FIG. 5 being inverted in comparison to FIG. 4.

As shown in FIG. 1, four separate circuitized sections 17 are spacedly located about a carrier (or frame) member 33 (see also FIGS. 2-5), which member is not shown in FIGS. 8 and 9 for purposes of clarity. Frame 33 is preferably plastic (a preferred material being polycarbonate), and of rectangular shape such that each section 17 is aligned and positioned on a respective one of the frame's four longitudinal sides 34. As depicted in FIGS. 1 and 4, frame 33 defines an internal, centrally disposed open portion 35, also of rectangular shape, the opening thereof designed to accommodate a semiconductor device (chip) 37 (FIGS. 2 and 3). Chip 37 is located on a lower surface of a common circuitized section 39 of flexible substrate 27 and is mechanically and electrically connected to each of the individual sections 17 which thus append therefrom. As shown particularly in FIG. 5 (and FIGS. 6, 7, 8 and 9), circuitry 41 is located on the upper surface of flexible section 17 and extends into common section 39, also occupying the upper surface thereof. Such circuitry is not depicted in FIGS. 2 and 3. This circuitry is connected to respective contact sites (not shown) on chip 37 to provide the desired operational features for this portion of assembly 10. This circuitry 41 may pass through the dielectric common section 39 (e.g., using plated-through-holes 28', as defined above and shown in FIG. 6) to be coupled to such contact sites (which are positioned along the surface of chip 37 facing and in contact with the dielectric substrate of section 39. It is also possible to locate chip 37 on the opposite side of the depressed common section 39 from that shown and thus provide direct connection to the terminal ends of circuitry 41. Still further, it is possible to provide a central orifice 42 (FIG. 7) within the central portion's dielectric and directly connect chip 37 to the terminal ends of circuitry 41. As shown in FIG. 7, such circuitry, being in the form of conductive lines formed on the dielectrics for both individual and common sections of substrate 16, thus serve to retain chip 37 in a suspended state separate from the common section's dielectric. Of added significance, it can be seen in FIGS. 6 and 7 that common section 39 is only connected (both mechanically and electrically) to the individual sections 17 by the portions of circuit lines 41 which extend therebetween. Being relatively thin and metallic (e.g., copper), this unique arrangement enables the centrally disposed common section to thermally expand and contract (directional arrows "D" in FIGS. 6 and 7) during package operation (and particularly in response to the heat generated by chip 37 during such operation). Such independent movement by section 39, in contrast to the fixed position of each individual section 17, represents an important aspect of the invention in that it assures the precise alignment of the individual contacts 19 and conductors 15, particularly during package operation.

The inverted orientation depicted in FIGS. 2, 3, 6 and 7 for chip 37 is preferred in order to assure enhanced heat sinking during operation of package 10. Although chip 37 is shown in a spaced orientation, it is possible to thermally join (e.g., using thermal paste) this element to the cover 51 (defined below) to even further enhance heat transfer.

In comparing FIGS. 1-4, it can be seen that each pressure exertion member 21 is positioned within a slot 43 within a respective side portion of the rectangular frame 33. Additionally, each member 21 also rests on a relatively rigid, metallic common support plate member 45, which, in a preferred embodiment of the invention, is a flat stainless steel plate having a thickness of about 0.025 inch. Members 21 are precisely spacedly aligned on plate 45 relative to each other and, of course, relative to the ultimate positions of respective circuits 17 on second substrate 16. Circuits 17 are in turn precisely located on common frame 33, e.g., using adhesives or pin-in-hole techniques to be defined in greater detail hereinbelow. Members 21 are preferably directly vulcanized onto the rigid support plate 45.

Package 10, as best seen in FIG. 1 and also partially in FIGS. 2, 3, 8 and 9, further includes retaining means 50 for retaining pressure exertion members 21 against individual sections 17 such that the defined predetermined force can be applied thereto. Means 50 comprises a retention (or cover) member 51 which is designed for being securely positioned on circuit member 13 in precise orientation relative to the circuitry thereon. Cap 51 is preferably metallic (e.g., aluminum) to assure effective heat sinking of chips 37 and structural rigidity and includes a plurality (four) of upstanding posts 53 which pass through respective alignment holes 55 located at the corners of rectangular frame 33, and further through corresponding holes 57 (only two shown in FIG. 1) in circuit member 13. Each post is then "captured" (retained) on the opposite side of member 13 to hold it in place. In a preferred embodiment, a substantially solid "stiffener" member 61 (e.g., of a suitable plastic such as glass-filled polyphenylene sulfide or of metallic material such as stainless steel), including apertures 63 therein for having the terminal ends of posts 53 extending therethrough, is used to provide structural reinforcement at this location of package 10. The stiffener provides support for substrate 13 to thus substantially prevent bending or bowing thereof. Each such post terminal end of retention member 51 further includes a slotted section 65 therein which in turn is designed for being engaged by a movable clamp member 67. Two clamp members 67 are used, one for each aligned pair of posts 53, each such retainer including a cam surface 69 to facilitate post "capture" during sliding engagement therewith. Clamp members 67 move in the lateral directions indicated by the arrows "L" in FIG. 1, it being understood of course that these may move in an opposite direction (away from one another)

and still function as intended. Such movement can also be seen in comparing FIGS. 2 and 3. Of significance, each clamp member 67, because of the use of camming action to effect engagement with posts 53, is uniquely able to engage posts 53 to different degrees to apply constant retention force to maintain the cover 51 against substrate 13 despite variations in thicknesses of the substrate and stiffener 61 components. This unique capability thus accommodates for tolerance differentials in some of the various parts that constitute the invention. As shown in FIGS. 1-3, cover 51 includes a plurality of upstanding feet members 68, each adapted for engaging an upper surface of substrate 13 during the aforementioned post 53 retention by clamp members 67. (Understandably, initial feet-substrate engagement occurs prior to such retention.) This unique means of assembling these components assures effective compensation for undesirable thickness tolerances which might exist, particularly in the first substrate and stiffener components. This feet-substrate engagement assures effective compression of the invention's elastomeric elements to the desired tolerance (see also below).

One of the significant features of the present invention involves the ability to readily remove the various components thereof from the first circuitized substrate 13 (e.g., in the event that repair and/or replacement of such components is deemed necessary). As defined above, the post-hole manner of alignment and post retention features cited above enable this to occur. Specifically, removal of the invention's clamp members may be readily accomplished, thus releasing the upstanding posts 53 (and member 51) such that member 51 may be relatively easily removed. In FIG. 1, such removal would occur in a downward direction. Upon such separation, repair and/or replacement (e.g., of the frame member and second circuitized substrate subassembly) can occur. It is also possible to remove and replace the various elastomer pressure exertion members and the accompanying support plate, if necessary. This separability assures substantially reduced costs for such replacement.

After such separation occurs, it is absolutely essential that the individual circuitized sections be capable of being repositioned (or new such sections added, if replacement of the second substrate is desired) such that the electrical contacts thereon are precisely aligned relative to the high density array of conductors on circuitized substrate 13. Because of the high density pattern of individual conductors and contacts as defined herein (more definition provided below), such alignment between these elements is deemed critical. In order to assure this, each of the flexible circuitized sections 17 is precisely aligned relative to the individual corresponding side portion of frame 33. Such alignment is uniquely provided during assembly of the frame 33-substrate 16 subassembly. Such assembly involves the positioning of the flexible substrate 16 on a set of alignment pins of the assembly fixture wherein such pins are inserted within corresponding alignment apertures 71 formed in the corners of each of the four individual sections 17. See particularly FIG. 5. These alignment apertures are in turn precisely aligned relative to the respective circuitry on each section 17 and preferably formed during formation thereof. In addition to these alignment apertures 71, the frame 33 further includes the aforementioned corner alignment holes 55, in addition to a pair of alignment apertures 73 formed within frame 33 concurrently with the formation of holes 55.

Apertures 73 are better seen in FIGS. 1 and 4. Frame 33, being plastic, is preferably formed by injection molding and such alignment between the respective apertures therein can thus be assured. The aforedescribed pins which engage the respective apertures 71 in sections 17 also pass through apertures 73 during subassembly formation. At this point, the individual sections 17 are precisely aligned relative to the assembly fixture. A second set of pins of the assembly fixture now engages the holes 55 in frame 33 to precisely align the frame to the fixture. This in turn effectively aligns the individual sections 17 to the alignment frame 33 (including particularly the corner holes 55 therein). The tightly toleranced fixture thus serves as a common reference datum, assuring the precision alignment essential between the flexible circuit and frame members of the invention. When such assembly is accomplished, each of the flexible sections 17 is thus horizontally aligned in a precise manner relative to the corresponding sides 34 of frame 33. The circuitized sections 17 are then secured to the respective sides 34, preferably using a suitable adhesive. The aforedescribed sets of fixture pins are then withdrawn and a final frame-substrate 16 subassembly results. The described upstanding posts 53 of retention member 51 pass through the frame's corner holes 55 when retainer 51 is attached to substrate 13. Because the holes 57 in substrate 13 are also precisely aligned relative to the individual patterns of conductors on substrate 13, the subassembly defined above (and particularly the individual contacts thereof) will be precisely aligned when clamping of member 51 occurs.

Figure 11:
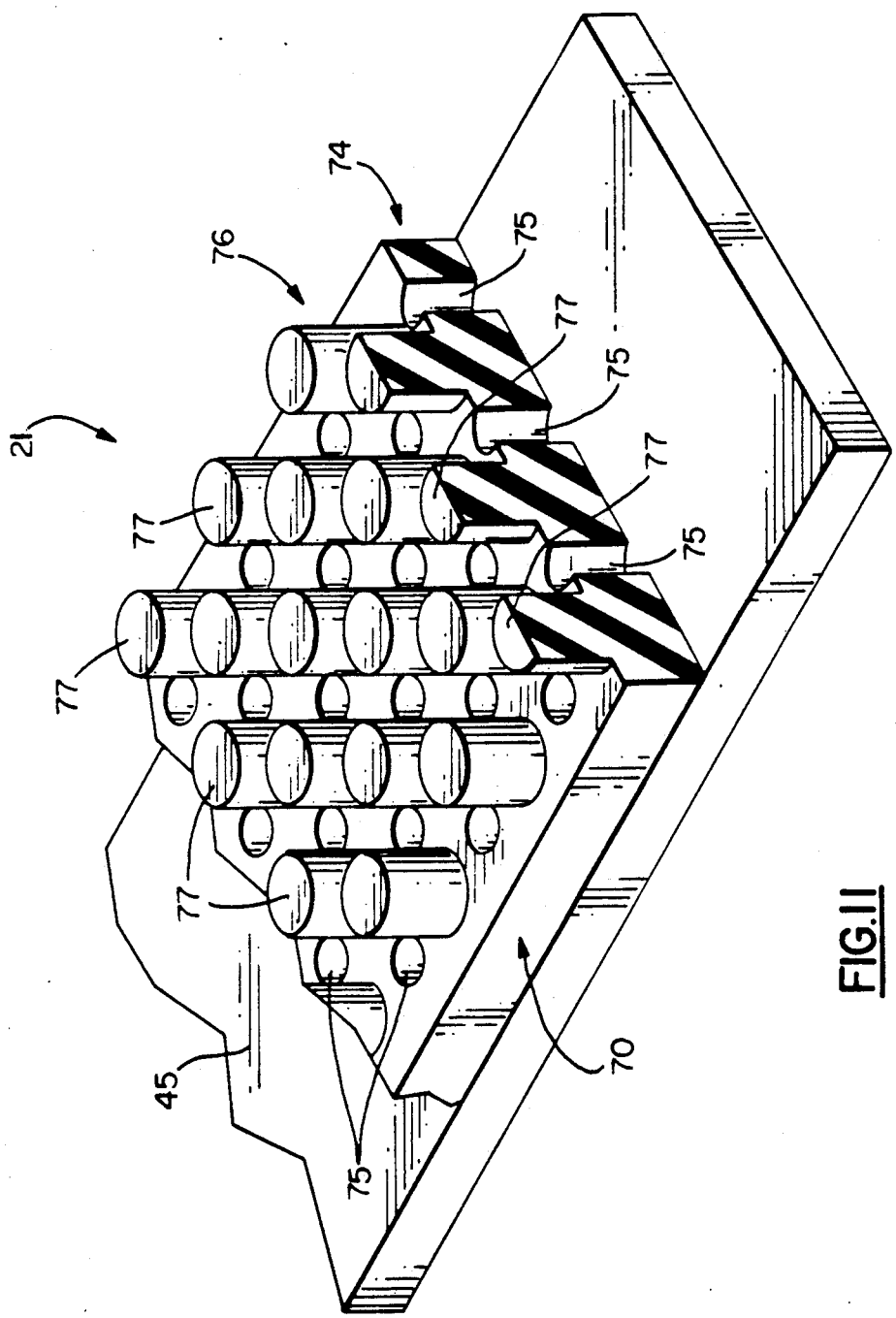
FIGS. 10 and 11 represent two embodiments of exertion members capable of being successfully utilized in the present invention, said FIGS. 10 and 11 being on a much enlarged scale.
Figure 10:
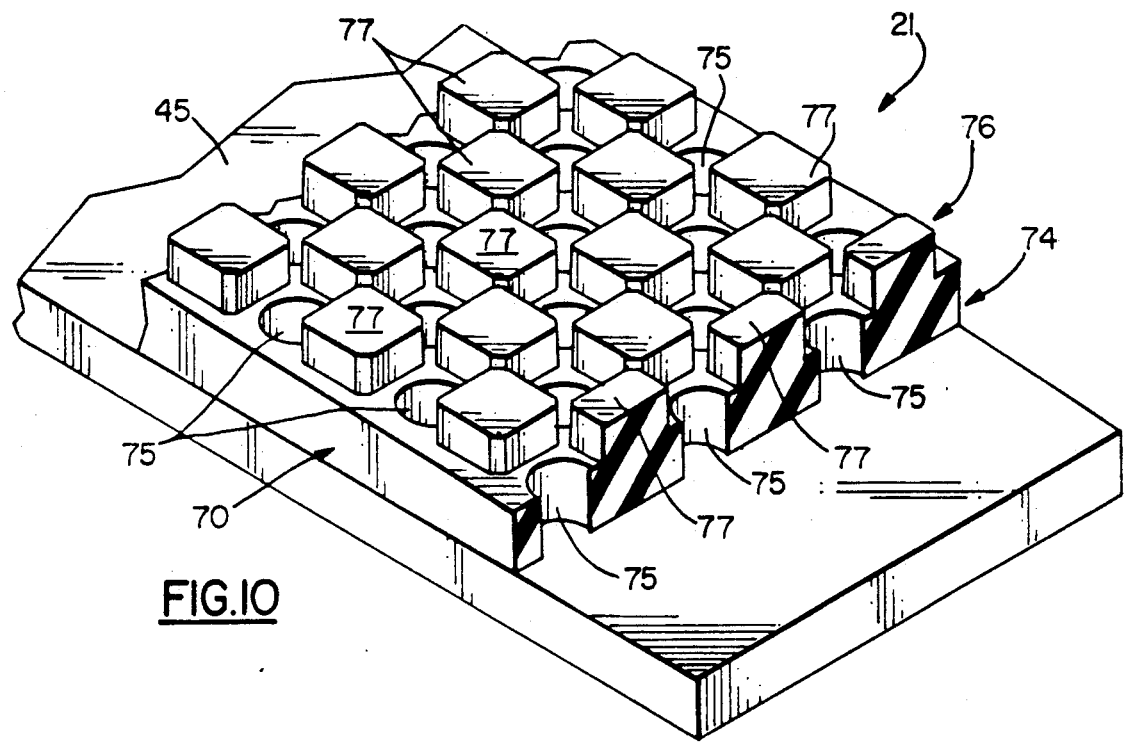

In FIGS. 10 and 11, there are shown preferred embodiments for pressure exertion members 21 capable of use in package 10. As will be explained, the embodiment depicted in FIG. 11 represents the more preferred embodiment over that of FIG. 10. Both, however, are readily capable of providing the predetermined pressure (force) against the invention's second substrate 16 to thus assure the sound, effective connections required herein. Exertion member 21, as depicted in FIGS. 10 and 11, comprises a bilayered elastomeric element 70 having a first layer 74 and an adjacent second layer 76. (See also FIGS. 8 and 9.) Elastomeric element 70 is preferably of integral construction and thus molded within a singular mold to the desired configurations (defined hereinbelow).

Proper selection of an appropriate elastomeric material for the invention's compressible exertion members is essential to achieve the desired results of long term stress retention, relatively low magnitude pressure (as defined herein), and operability at relatively high temperatures and humidity. A preferred material selected for use in the instant invention is a low compression set polysiloxane rubber available from the DOW Corning Corporation and sold under the name Silastic LCS-745U (Silastic is a registered trademark of the Dow Corning Corporation). This clean, low modulus elastomer demonstrates a seventy to eighty percent retention of residual compressive stress when loaded in constant deflection at an elevated temperature (e.g., 100 degrees Celsius) for a prolonged period.

The aforementioned silicone rubber is available from the Dow Corning Corporation in stock form. After being press vulcanized, such parts are serviceable (operable) over a temperature range of from about −73 degrees Celsius (C.) to +250 degrees C. and possess the highly desired features of good reversion (heat resistance), low compression set and good resistance to hot oils, water and steam. The described silicone rubber, as molded, possesses a durometer hardness (Shore A) of 52, a tensile strength of about 830 pounds per square inch and an elongation of about 260 percent.

Figure 12:
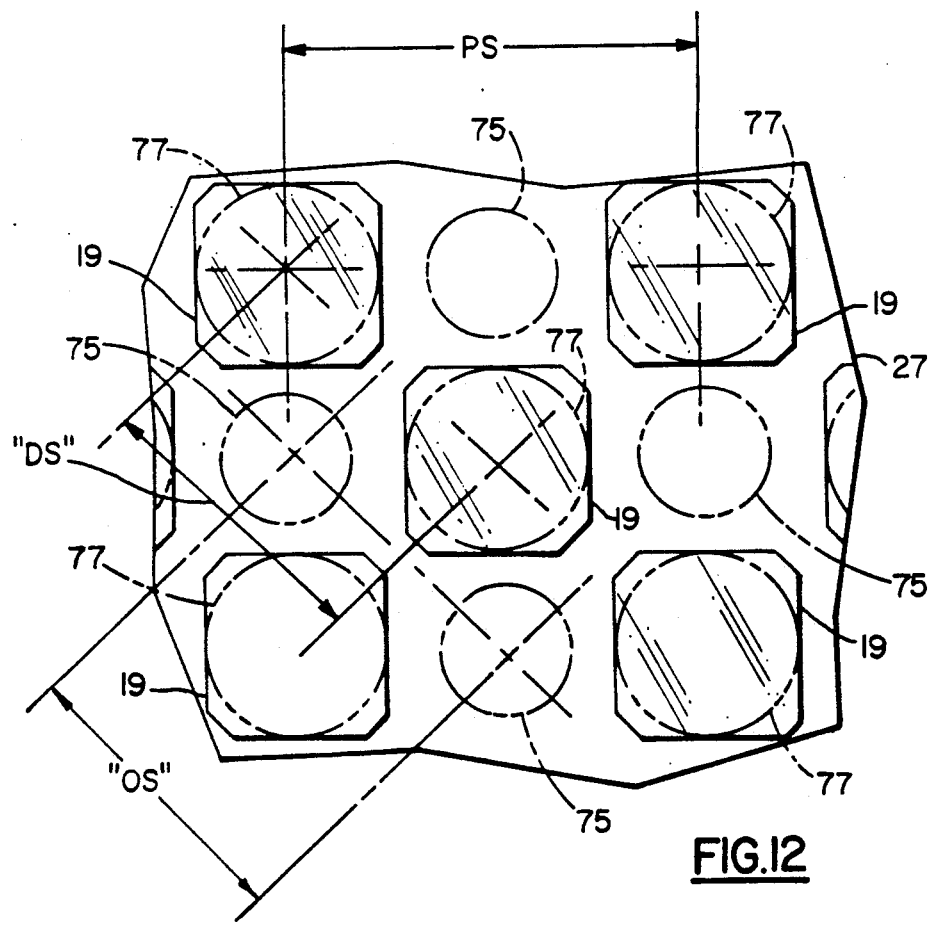
FIG. 12 is a partial, much enlarged view, taken along the line 12—12 in FIG. 8, illustrating the relative patterns of electrical contacts and associated elastomeric projections for one of the exertion members of the invention, said electrical contacts being located on the invention's second circuitized substrate.

The first layer 74 of element 70 is preferably of substantially solid configuration and includes a plurality of openings 75 spacedly located therein in accordance with a predetermined pattern (see particularly FIG. 12). These openings are considered essential for reasons stated below. Each opening 75 is preferably of substantially cylindrical configuration and extends through the entire thickness ("T10" in FIG. 8). Dimension "T10" represents the original thickness of first layer 74 prior to full compression of elastomeric element 70 so as to achieve the desired connections between respective arrays of contacts 19 and conductors 15. As further seen in FIG. 12, these openings 75 occupy a substantially rectangular pattern and, in one embodiment of the invention, were spaced apart (dimension "OS" in FIG. 12) at a distance within the range of from about 0.068 inch to about 0.074 inch. Each cylindrical opening in turn possessed an internal diameter of only about 0.030 inch.

It is understood that openings possessing this configuration and pattern are preferably utilized in both of the embodiments of elastomeric element 70 as depicted in FIGS. 10 and 11. The aforementioned spacings are also preferably utilized in both such embodiments.

In the embodiment of FIG. 10, the second layer 76 for element 70 includes a plurality of upstanding projections 77 located in a pre-established pattern, this pattern being substantially identical to that for the respective array of contacts 19 located on the respective circuitized section 17 of flexible substrate 16 which is engaged (and acted against) by the respective elastomeric element 70. In one example of the invention, a total of 48 and 87 projections 77 were utilized per individual elastomeric element to align with a similar number of contacts 19 on the flexible substrate 16 being engaged. Thus, a total of about 190 to about 350 such projections 77 may be utilized in an assembly 10 using four such elastomeric elements and associated flexible circuit sections. A preference number is about 270. Preferably, a similar number of such projections are utilized for the embodiment of FIG. 11.

Understandably, the defined projections 77 do not physically engage the respective contacts 19, but instead engage the back surface of the dielectric (e.g., polyimide) of the flexible substrate. Significantly, however, these projections individually align with the respective contacts located in the defined pattern on the opposite surface thereof in order to achieve the ultimate application of pressure force taught herein. Of further significance, however, the invention is able to provide such force application even in the event of slight displacement between these projections and associated conductors.

In the above example, the pressure provided by a singular elastomeric element 21 was within the range of about ten to about fifty pounds per square inch, said force deemed sufficient to provide the appropriate sound connections required herein. As part of this application, it is considered essential that each of the upstanding projections 77 are compressed from about fifteen to about thirty-five percent of the original, unstressed height (thickness) thereof during exertion of the defined pressure. (Ideally, a compression of twenty-five percent is achieved.) Such an unstressed height (thickness) is represented by the dimension "T20" in FIG. 8. Significantly, both first and second layers 74 and 76 compress to the above extent (about fifteen to about thirty-five percent of original, unstressed height) when in final compression. Such compressed thicknesses are illustrated in FIG. 9 by the dimensions "T1C" and "T2C", respectively. As further seen in FIG. 9, each of the compressible upstanding projections and associated, compressible first layer are thus compressed to a total thickness represented by the dimension "TC" in FIG. 9, from an original thickness of "TO" (FIG. 8).

Most significantly, this dual compression is attained without buckling or other undesired disfigurement of the elastomeric element, thus assuring the required pressures taught herein. This unique capability is assured, in part, through the utilization of the aforedefined openings 75 which, during compression, are also compressed in the manner indicated in FIG. 9. That is, the outwardly expanding elastomeric for first layer 74 extends within the adjacent accommodating openings 75 to maintain the vertical integrity of each layer within the composite elastomeric element.

In the embodiment of FIG. 10, each upstanding projection 77 is preferably of substantially box-like configuration (thus of substantially rectangular cross-sectional configuration when depicted in both elevational and plan views). In the embodiment of FIG. 11, each projection 77 is of substantially cylindrical configuration, possessing, in one embodiment of the invention, an outer diameter of about 0.047 inch. In comparing FIG. 12 (FIG. 12 directed to the embodiment of element 70 as shown in FIG. 11), the specific pattern for such cylindrical projections 77 relative to the adjacent openings 75 and the corresponding, respective contacts 19 is seen. FIG. 12 is taken along the line 12—12 in FIG. 8. These projections and adjacent openings, located opposite the contacts 19 (on the opposite side of substrate 27) are thus hidden and represented by dashed lines. As further seen in FIG. 12, the center-to-center spacing between cylindrical projections 77 located on directly opposite sides of the interim accommodating opening 75 is represented by the dimension "PS". In one example, this spacing was within the range of from about 0.098 to about 0.102 inch. The associated diagonal spacing, represented by the dimension "DS" in FIG. 12 between the immediately adjacent cylindrical projections 77, in the pattern as shown in FIG. 12, was, in one embodiment of the invention, within the range of from about 0.065 inch to about 0.075 inch. When utilizing projections in accordance with the patterns illustrated herein and at dimensions as defined herein, it is possible in the instant invention to provide suitable connections between arrays of similarly patterned conductors which occupy the respective substrate at a density of about 200 per square inch. Tighter array patterns (e.g., as high as about 400 per square inch) may be achieved using these teachings. This extremely high density of such conductors is, of course, a highly desirable design feature for microelectronic and similar circuits in which the instant invention may be utilized. As understood, such circuits are particularly useful in the information handling system (computer) field.

With particular attention to FIG. 12, it is also seen that each of these contacts 19 (as well as conductors 15, for that matter) is of substantially rectangular configuration. That is, each contact 19 is a substantially rectangular metallic pad possessing the thicknesses mentioned above. Such pads are located on respective substrates in the patterns illustrated so as to be positioned relative to each other at center-to-center spacings cited above. It is understood, of course, that other configurations for such pads, including cylindrical, are readily possible. In accordance with teachings herein, the use of rectangular pads in combination with cylindrical projections is preferred to assure maximum pressure application against each conductor when assembly 10 is in the final (compressed) condition.

In order to assure that the deflections of each layer 74 and 76 are maintained in the desired range stated above, the thickness of each layer needs to be inversely proportional to the "spring rate" of each layer. By definition, the spring rate per layer is the force required to compress each respective layer a given distance. Use of a bilayered structure as defined herein assures that buckling of the final structure is substantially prevented. Specifically, the substantially solid lower layer 74, including the defined pattern of openings therein relative to the adjacent upstanding projections for the adjacent first layer, increases the buckling load of the lower layer and allows use of shorter height upstanding projections, thus creating a more stable structure. Use of such an integral, apertured layer for the layer which engages the flexible circuit is not essential because force application is only deemed necessary where individual paired arrays of contacts are being mated. Because the total force contained by the structure is the elastomer compressive stress at the elastomer-flexible circuit interface times the interface contact area, superfluous areas of contact are considered a detriment. It is for this reason that cylindrical projections are desired over those of the substantially box-like configuration, as such configurations, using the dimension cited herein, possess approximately twenty percent less area of contact than rectangular (box-like) projections of the same external (width) dimensions. Additional reasons for utilizing cylindrical projections include ease of mold construction, ease of mold filling, reduction in stress gradients due to corners, and the fact that the corners of the rectangular projections increase the opportunity for engagement between adjacent such projections. This is substantially eliminated using cylindrical projections.

Regardless of whether rectangular (box-like) or cylindrical projections are used, the elastomeric elements as taught herein possess the ability to conform to uneven surface elevations within the respective components being joined such that low points thereof receive sufficient force to assure proper contact pressure. As understood, this requires an elastomer having a relatively low spring rate such that only a few percent compression is required to adjust for out-of-flatness tolerances in adjacent surfaces. Total deflection (e.g., twenty-five percent) thus provides a generally uniform contact pressure over the array.

Thus there has been shown and described an electronic package wherein an flexible circuit is removably attached to a circuitized substrate such as a printed circuit board to thus assure facile means for repair and/or replacement of various elements of the package. Significantly, the invention is able to provide this while also providing means whereby highly dense arrays of individual electrical contacts (and conductors) are precisely aligned and mated during package operation, thus assuring the miniaturization considered essential in many of today's packaging designs. Such connections are enhanced through the utilization of a specially designed elastomeric structure which assures the appropriate contact force for each contact/conductor combination.

While there have been shown and described what are at present considered the preferred embodiments of the invention, it will be obvious to those skilled in the art that various changes and modifications may be made therein without departing from the scope of the invention defined by the appended claims.

What is claimed is:

1. An electronic package comprising:
   a first circuitized substrate including a plurality of electrical conductors located on a surface thereof in a predetermined pattern;
   a frame member removably positioned on said first circuitized substrate in a manner so as to be precisely aligned relative to said predetermined pattern of said conductors;
   a semiconductor device electrically coupled to said first circuitized substrate;
   a second circuitized substrate including a common circuitized section and a plurality of individual circuitized sections electrically and mechanically connected to said common section, each of said individual circuitized sections securedly positioned and precisely aligned on said frame member and including a plurality of electrical contacts located thereon in a pre-established pattern and adapted for engaging respective ones of said electrical conductors of said first circuitized substrate, said common section adapted for thermally expanding relative to said plurality of circuitized sections, said semiconductor device fixedly positioned on said common circuitized section and electrically connected thereto, said semiconductor device coupled to said first circuitized substrate through said second circuitized substrate;
   pressure exertion means including a plurality of exertion members for exerting a predetermined pressure against said individual circuitized sections of said second circuitized substrate to cause said electrical contacts thereon to engage said respective ones of said electrical conductors of said first circuitized substrate; and
   means for retaining said plurality of exertion members against said individual circuitized sections to cause said exertion members to exert said pressure against said individual circuitized sections.

2. The electrical package according to claim 1 wherein said first circuitized substrate comprises a printed circuit board.

3. The electronic package according to claim 2 wherein each of said electrical conductors of said first circuitized substrate comprises a metallic pad.

4. The electronic package according to claim 1 wherein said second circuitized substrate comprises a flexible circuit.

5. The electronic package according to claim 4 wherein each of said electrical contacts of said second circuitized substrate comprises a metallic pad.

6. The electronic package according to claim 1 wherein each of said exertion members of said pressure exertion means comprises a bilayered elastomeric element having a first layer including a plurality of openings spacedly located therein in a predetermined pattern and a second layer adjacent said first layer and including a plurality of upstanding projections located in a pre-established pattern relative to said pattern of openings in said first layer, each of said upstanding projections adapted for aligning with a respective one of said electrical contacts of said second circuitized substrate and for engaging said second circuitized substrate to exert said predetermined pressure thereagainst.

7. The electronic package according to claim 6 wherein selected ones of said openings within said first layer of said bilayered elastomeric elements are located within said first layers substantially adjacent a respective one of said upstanding projections and substantially between said respective projection and a second projection adjacent thereto.

8. The electronic package according to claim 7 wherein each of said selected ones of said openings is of substantially cylindrical configuration.

9. The electronic package according to claim 8 wherein said upstanding projections are of a substantially box-like configuration.

10. The electronic package according to claim 8 wherein said upstanding projections are of a substantially cylindrical configuration.

11. The electronic package according to claim 6 wherein said predetermined pressure provided by each of said exertion members is within the range of from about ten to about fifty pounds per square inch.

12. The electronic package according to claim 11 wherein said first and second layers of each of said elastomeric elements are each compressed from about fifteen to about thirty-five percent of the original, unstressed height thereof during said exertion of said predetermined pressure.

13. The electronic package according to claim 12 wherein each of said bilayered elastomeric elements is comprised of silicone rubber.

14. The electronic package according to claim 1 wherein said frame member includes a plurality of side portions and a substantially centrally disposed open portion, each of said individual circuitized sections of said second circuitized substrate being fixedly secured to a respective one of said side portions and said common circuitized section of said second circuitized substrate being located substantially within said open portion.

15. The electronic package according to claim 14 wherein each of said side portions of said frame member includes a slot therein, each of said exertion members of said pressure exertion means being located substantially within a respective one of said slots.

16. The electronic package according to claim 14 wherein said frame member includes a plurality of alignment holes therein, each of said individual circuitized sections being aligned and fixedly secured to said respective side portion of said frame member relative to said alignment holes.

17. The electronic package according to claim 1 wherein said second circuitized substrate comprises a dielectric member having a plurality of circuit lines thereon, said common circuitized section being electrically and mechanically connected to said individual circuitized sections by only said circuit lines.

18. The electronic package according to claim 1 wherein said means for retaining said exertion members against said individual circuitized sections of said second circuitized substrate comprises a retention member including a plurality of upstanding posts thereon, said first circuitized substrate including a plurality of holes therein, said upstanding posts aligning with and extending through respective ones of said holes.

19. The electronic package according to claim 18 further including a pair of clamp members, each of said clamp members engaging a respective pair of said upstanding posts extending through said holes in said first circuitized substrate to secure said retention member on said first circuitized substrate.

20. The electronic package according to claim 19 wherein each of said clamp members engages a respective one of said pairs of posts in a camming manner.

21. The electronic package according to claim 19 further including a stiffener member for being located against said first circuitized substrate and for being engaged by said clamp members during said engaging of said posts, said stiffener providing support for said first circuitized substrate during said engagement so as to substantially prevent bending thereof.

22. The electronic package according to claim 18 wherein said frame member includes a plurality of side portions and a substantially centrally disposed open portion, each of said individual circuitized sections of said second circuitized substrate being fixedly secured to a respective one of said side portions and said common circuitized section of said second circuitized substrate being located substantially within said open portion, said frame member including a plurality of alignment holes therein, said individual circuitized sections being aligned and fixedly secured to said respective side portions relative to said alignment holes.

23. The electronic package according to claim 22 wherein said frame member further includes a plurality of alignment holes, each of said upstanding posts also extending through a respective one of said alignment holes of said frame member during said retention of said exertion members.

24. The electronic package according to claim 18 further including a support plate member located on said retention member, said exertion members being positioned on said support plate member in a predetermined pattern of alignment.

* * * * *